US009306585B1

(12) United States Patent
Elkholy et al.

(10) Patent No.: US 9,306,585 B1
(45) Date of Patent: Apr. 5, 2016

(54) FRACTIONAL-N MULTIPLYING INJECTION-LOCKED OSCILLATION

(71) Applicant: Xilinx, Inc., San Jose, CA (US)

(72) Inventors: Ahmed M. Elkholy, Champaign, IL (US); Mohamed N. Elzeftawi, Santa Clara, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/613,648

(22) Filed: Feb. 4, 2015

(51) Int. Cl.
*H03L 7/06* (2006.01)
*H03L 7/099* (2006.01)
*H03L 7/085* (2006.01)

(52) U.S. Cl.
CPC .............. *H03L 7/0991* (2013.01); *H03L 7/085* (2013.01)

(58) Field of Classification Search
USPC .................................. 327/147–149, 156–158
See application file for complete search history.

(56) References Cited

U.S. PATENT DOCUMENTS

| | | | | |
|---|---|---|---|---|
| 8,710,883 B1* | 4/2014 | Fang | ...................... | H03L 7/0891 327/148 |
| 8,841,948 B1* | 9/2014 | Chien | ...................... | H03L 7/07 327/149 |
| 2007/0146038 A1* | 6/2007 | Werner | ...................... | G06F 1/04 327/291 |
| 2009/0167451 A1* | 7/2009 | McCorquodale | ........ | H03B 5/06 331/176 |
| 2011/0127990 A1* | 6/2011 | Wilson | ...................... | H04L 25/49 324/76.44 |
| 2012/0161827 A1* | 6/2012 | Madeira | ...................... | G06F 1/06 327/147 |
| 2015/0303930 A1* | 10/2015 | Chen | ...................... | H03L 7/093 327/156 |

OTHER PUBLICATIONS

Chien, Jun-Chau et al., "A Pulse-Position-Modulation Phase-Noise-Reduction Technique for a 2-to-16GHz Injection-Locked Ring Oscillator in 20nm CMOS," *2014 IEEE International Solid-State Circuits Conference Digest of Technical Papers*, Feb. 9, 2014, pp. 52-53, IEEE, Piscataway, New Jersey, USA.

Huang, Po-Chun et al., "A 2.3GHz Fractional-N Dividerless Phase-Locked Loop with -112dBc/Hz In-Band Phase Noise," *2014 IEEE International Solid-State Circuits Conference Digest of Technical Papers*, Feb. 9, 2014, pp. 362-363, IEEE, Piscataway, New Jersey, USA.

Marucci, Giovanni et al., "A 1.7GHz MDLL-Based Fractional-N Frequency Synthesizer with 1.4ps RMS Integrated Jitter and 3mW Power Using a 1 b TDC," *2014 IEEE International Solid-State Circuits Conference Digest of Technical Papers*, Feb. 9, 2014, pp. 360-361, IEEE, Piscataway, New Jersey, USA.

\* cited by examiner

*Primary Examiner* — Adam Houston
(74) *Attorney, Agent, or Firm* — W. Eric Webostad

(57) ABSTRACT

An apparatus relates generally to the generation of an oscillating signal. In this apparatus, a fractional-N generator is for receiving a frequency control word and a reference signal. A multiplying injection-locked oscillator is coupled to the fractional-N generator for receiving a clock signal for outputting an oscillating signal. A frequency tracking loop is coupled to the fractional-N generator for receiving the clock signal, and further coupled to the multiplying injection-locked oscillator for receiving the oscillating signal.

20 Claims, 9 Drawing Sheets

FRACTIONAL-N MULTIPLYING INJECTION-LOCKED OSCILLATION

TECHNICAL FIELD

The following description relates to integrated circuit devices ("ICs"). More particularly, the following description relates to fractional-N multiplying injection-locked oscillation for an IC.

BACKGROUND

Conventionally, a clock signal may be synthesized from a reference signal provided from a crystal oscillator. There are many limitations with conventional devices used to provide an oscillating signal with a clock pattern, including semiconductor area usage and jitter, among others.

Hence, it is desirable and useful to provide clock synthesis that overcomes one or more of the above-described limitations.

SUMMARY

An apparatus relates generally to the generation of an oscillating signal. In such an apparatus, a fractional-N generator is for receiving a frequency control word and a reference signal. A multiplying injection-locked oscillator is coupled to the fractional-N generator for receiving a clock signal, and for outputting an oscillating signal. A frequency tracking loop is coupled to the fractional-N generator for receiving the clock signal, and further coupled to the multiplying injection-locked oscillator for receiving the oscillating signal.

A method relates generally to the generation of an oscillating signal. In such a method, a reference signal and a frequency control word are received by a fractional-N generator for outputting a clock signal. The clock signal is received by a multiplying injection-locked oscillator and a frequency tracking loop. An oscillating signal is output from the multiplying injection-locked oscillator. The oscillating signal is fed back to the frequency tracking loop. The frequency tracking loop is coupled to the fractional-N generator and to the multiplying injection-locked oscillator.

A system relates generally to the generation of a plurality of oscillating signals. In such a system, a plurality of fractional-N multiplying injection-locked oscillators is commonly coupled to receive a reference signal. Each fractional-N multiplying injection-locked oscillator of the plurality of fractional-N multiplying injection-locked oscillators includes a fractional-N generator, a multiplying injection-locked oscillator, and a frequency tracking loop. The fractional-N generator is for receiving a frequency control word and the reference signal. The multiplying injection-locked oscillator is coupled to the fractional-N generator for receiving a clock signal for outputting an oscillating signal. The frequency tracking loop is coupled to the fractional-N generator for receiving the clock signal, and further coupled to the multiplying injection-locked oscillator for receiving the oscillating signal.

Other features will be recognized from consideration of the Detailed Description and Claims, which follow.

BRIEF DESCRIPTION OF THE DRAWINGS

Accompanying drawings show exemplary apparatus(es) and/or method(s). However, the accompanying drawings should not be taken to limit the scope of the claims, but are for explanation and understanding only.

DETAILED DESCRIPTION

Figure 1:
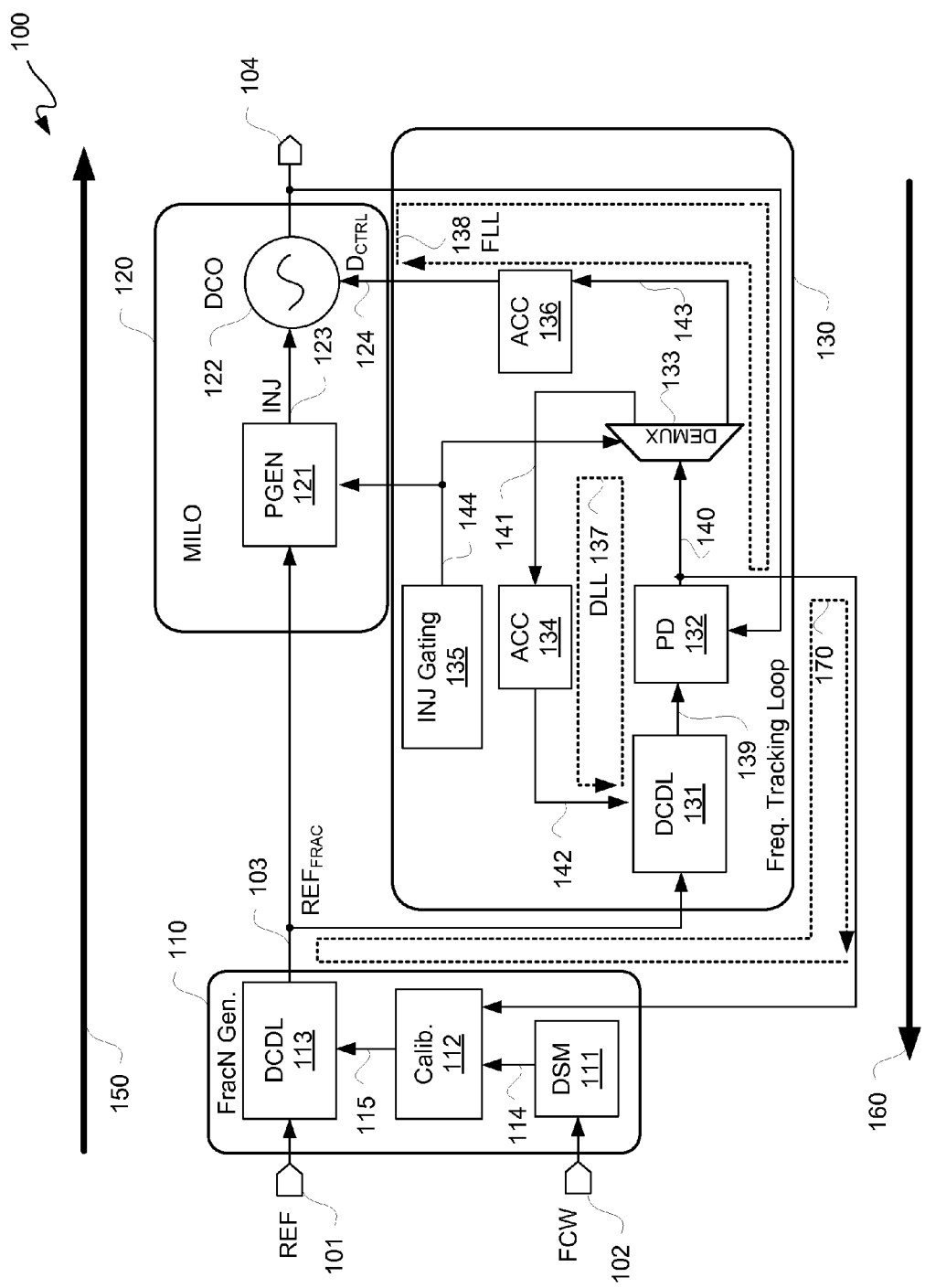
FIG. 1 is a block diagram depicting an exemplary fractional-N multiplying injection-locked oscillator ("fractional-N MILO").

In the following description, numerous specific details are set forth to provide a more thorough description of the specific examples described herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Before describing the examples illustratively depicted in the several figures, a general introduction is provided to further understanding.

Conventionally, a fractional-N phase-locked loop ("FN-PLL") using a ring-voltage controlled oscillator ("ring-VCO") could be used to provide compact multi-phase clock signaling capability. Such FN-PLLs were compact enough to be in transceivers with a wide frequency range, where the maximum frequency is at least twice the minimum frequency. However, such FN-PLLs conventionally suffer from phase noise limiting overall performance. Such phase noise conventionally precludes FN-PLLs from high data rate applications, namely data rates greater than approximately 10 gigabits per second ("10 Gbps").

On the other hand, inductor-capacitor-VCOs ("LC-VCOs") conventionally have superior phase noise performance with respect to ring-VCOs for high data rate applications. However, conventionally an LC-VCO consumes a significant amount of semiconductor area with a limited frequency range in comparison to a ring-VCO. Frequency range may be increased with multi-inductor LC-VCOs; however, this consumes more semiconductor area and adds complexity. Therefore, clock signals from LC-VCOs may have to be shared among multiple transceivers to be economical. Accordingly, high frequency clock signals may be driven a significant distance from source to sink. For example, if an LC-VCO were to drive four communications channels, namely four lanes, then there may be significant routing distances from such LC-VCO to each of four transceivers with a large power penalty.

As described below in additional detail, a clock generator is described that is compact enough for being located close to a sink, such as one or more transceivers, transmitters, and/or receivers. This clock generator has low jitter compared with an FN-PLL. Furthermore, a clock generator as described below is a clock multiplier, so a low frequency reference signal may be used to provide a high frequency output signal with a clock pattern. Having a low frequency reference signal allows such signal to be routed over a long distance with less power consumption than a high frequency reference signal. Additionally, to support multiple non-integer frequencies, a fractional-N multiplying injection-locked oscillator ("fractional-N MILO") is described below.

A fractional-N MILO is to be contrasted with a fractional-N multiplying delay-locked loop ("FN-MDLL"), the latter of which has timing constraints limiting output frequency to approximately 2 GHz. As described below, a fractional-N MILO is described for use in high-frequency applications, namely approximately equal to or greater than 10 GHz. Furthermore, an integer-N operation of a MILO is overcome by aligning edges of an oscillating output signal to edges of a clock signal input for injection locking multiplication, which is not limited to integer-N operation.

With the above general understanding borne in mind, various configurations for fractional-N multiplying injection-locked oscillation are generally described below.

FIG. 1 is a block diagram depicting an exemplary fractional-N multiplying injection-locked oscillator ("fractional-N MILO") 100. Fractional-N MILO 100 may be used for generating an oscillating signal 104, such as may be used in data communications.

Fractional-N MILO 100 includes a fractional-N generator 110, a multiplying injection-locked oscillator ("MILO") 120, and a frequency tracking loop 130. If digitally controlled oscillator ("DCO") 122 of MILO 120 is not subject to variation due to process-voltage-temperature ("PVT") variation, then frequency tracking loop 130 may be omitted. However, PVT variations are generally to be considered in an implementation, and so it shall be assumed that frequency tracking loop 130, along with a calibration block 112 of fractional-N generator 110, are used.

MILO 120 may include a pulse generator ("PGEN") 121 and a DCO 122. In the following description, a digital implementation is described; however, in another implementation analog components may be used. In this example, DCO 122 may be implemented with a ring-voltage-controlled oscillator ("VCO") for operation at high frequencies, namely frequencies above 10 GHz.

Pulse generator 121 may be coupled to fractional-N generator 110 for receiving a clock signal 103 associated with a fractional-N multiplication. This clock signal 103 effectively is a reference fraction clock signal generated in part using a reference signal 101. Generally, by a "clock signal", it is meant an oscillating signal with a clock pattern. Along those lines, signals 101, 103, and 104 may all generally be oscillating signals with a clock pattern; however, these signals are respectively referred to as a reference signal 101, a clock signal 103, and an oscillating signal 104 for purposes of clarity.

DCO 122 may be coupled to pulse generator 121 for receiving a pulse injection signal 123 for outputting an oscillating signal 104. Pulse generator 121 may be used to generate narrow pulses at a reference rate, namely a frequency of reference signal 101. These pulses may be injected in DCO 122 to periodically correct zero crossings and to mitigate jitter accumulation in DCO 122 to produce oscillating signal 104 with reduced jitter.

Frequency tracking loop 130 may include a delay-locked loop ("DLL") 137 and a frequency-locked loop ("FLL") 138, as generally respectively indicated with dotted lines. DLL 137 may be coupled to fractional-N generator 110 for receiving clock signal 103 and coupled to MILO 120 for receiving oscillating signal 104 for providing an error signal 140. FLL 138 may be coupled to MILO 120 for receiving oscillating signal 104 and coupled to DLL 137 for receiving error signal 140 for providing a digital control signal ("$D_{CTRL}$") 124 to DCO 122 for adjusting frequency of oscillating signal 104. Frequency tracking loop 130 may be used to set a free-running frequency of DCO 122 close to a target frequency, as described below in additional detail.

Fractional-N generator 110 includes a delta-sigma modulator ("DSM") 111, a calibration block 112, and a digitally-controlled delay line ("DCDL") 113. Delta-sigma modulator 111 may be coupled for receiving a frequency control word ("FCW") 102 associated with a frequency multiplication factor. Frequency control word 102 may be a user provided input signal, and reference signal 101 may be provided from an external or internal oscillator (not shown). Calibration block 112 may be coupled to delta-sigma modulator 111 for receiving a digital word 114 and coupled to frequency tracking loop 130 for receiving error signal 140. DCDL 113 may be coupled to calibration block 112 for receiving a phase or delay digital control signal 115 for adjusting phase or delay of reference signal 101, a provided input to DCDL 113, to coincide with a period of oscillating signal 104. Along those lines, because edges of oscillating signal 104 are to be aligned to edges of a clock signal 103 used to generate oscillating signal 104, various contributors to edge misalignment are addressed, as described below in additional detail.

Fractional-N generator 110 extends operation of MILO 120 for fractional-N multiplication. Along those lines, fractional-N generator 110 may align injected pulses ("INJ") of pulse injection signal 123 with edges of oscillating signal 104 according to a frequency control word 102 input for fractional-N operation.

Generally, MILO 120 may lock phase of oscillating signal 104 of DCO 122 to injected pulses of pulse injection signal 123. Pulse injection signal 123 may provide a stream of clean narrow pulses to DCO 122, and these pulses may be used to periodically reset jitter accumulation of DCO 122. Pulse generator 121 via such pulses may effectively high pass filter a phase noise profile of DCO 122. This operation may be performed open-loop with no phase detector in contrast to a conventional first-order phase-locked loop ("PLL"). Using a MILO instead of a PLL may allow for various improvements in operation, which may include one or more of: a wider filtering bandwidth for oscillator noise; in-band noise not subject to charge pump or time-to-digital converter ("TDC") noise; improved supply rejection responsive to operation with a wider bandwidth; less power consumption for performance; and/or a faster transient response due to operation with a wider bandwidth.

Filtering bandwidth of MILO 120 may depend on injection strength of pulse generator 121. Along those lines, pulse generator 121 may have an adjustable injection strength.

To operate MILO 120 with robust operation across PVT variations, even with a narrow frequency locking range, a frequency tracking loop is used so that the free-running frequency of DCO 122 is close enough to a target frequency for an injection-locking condition. An initial frequency calibration, as well as any subsequent frequency calibrations, may be obtained by using FLL 138. Even though an FLL 138 is used in this example for a digital implementation, in another implementation a PLL may be used instead of an FLL. FLL 138 may be used to tune DCO 122 to a target frequency, then FLL 138 may effectively be "turned off" and injection-locking may be "turned on". FLL 138 may be periodically "turned back on" with injection-locking being "turned off" for recalibration or tuning to a different target frequency. Accordingly, a number of cycles of clock signal 103 may be counted for periodically invoking FLL 138 and de-asserting DLL 137.

However, operation of FLL 138 may not adequately compensate for temperature and/or voltage, such as voltage supply, variations. To avoid or mitigate against loss of lock by MILO 120, such as for example due to temperature drift or loop filter leakage, DLL 137 of frequency tracking loop 130 may run in the background during operation of fractional-N MILO 100.

DLL 137 of frequency tracking loop 130 may include a DCDL 131, a phase detector 132, and an accumulator ("ACC") 134. In this example, a demultiplexer ("demux") 133 is included in the loops of DLL 137 and FLL 138. Frequency tracking loop 130 may include an injection gating block 135. Injection gating block 135 may be coupled for providing an injection gating signal 144 to pulse generator 121 and to a demultiplexer 133 of DLL 137/FLL 138. Frequency tracking loop 130 may be configured for either operation of a first mode for operating DLL 137 or a second mode for operating FLL 138.

Injection gating block 135 may be configured to periodically assert injection gating signal 144 to "turn off" pulse generator 121 for operation in such second mode. Pulse generator 121 need not be powered off, rather injection pulses may be blocked from being on pulse injection signal 123 output from pulse generator 121. In such second mode, frequency-locked loop 138 may be locked to a free-running frequency of DCO 122 with output of pulses from pulse generator 121 disabled. Injection gating block 135 may further be configured to de-assert injection gating signal 144 after a lock is obtained by FLL 138, or after some amount of time to "turn on" pulse generator 121, namely to reactivate pulses being on pulse injection signal 123 for injection locking in such first mode. In such first mode, DLL 137 may be updated with pulse generator 121 actively providing pulses to DCO 122 via pulse injection signal 123.

To switch between using DLL 137 in a first mode and FLL 138 in a second mode, injection gating block 135 may provide injection gating signal 144 to pulse generator 121 and to a demultiplexer 133 of DLL 137/FLL 138.

Again, DLL 137 of frequency tracking loop 130 may include a DCDL 131, a phase detector 132, and an accumulator 134. DCDL 131 may be coupled to DCDL 113 of fractional-N generator 110 for receiving clock signal 103, where clock signal 103 is commonly provided to pulse generator 121 of MILO 120 as a fractional-N reference.

Phase detector ("PD") 132 may be coupled to DCO 122 for receiving oscillating signal 104 and to DCDL 131 for receiving a phase or delay adjusted version of clock signal 103, namely adjusted signal 139. In this example, phase detector 132 is clocked directly from oscillator output for sub-sampling ("SS") operation; however, in another implementation, the oscillator output can be divided with a fractional divider with more complexity and higher power consumption phase detector. Moreover, in this example a bang-bang ("BB") phase detector 132 is used. However, in another implementation, a "multi-level" phase detector, namely more levels than a bang-bang phase detector, may be used. Effectively, bang-bang phase detector 132 indicates whether phase of oscillating signal 104 either leads or lags adjusted signal 139.

Accumulator 134 may be coupled to phase detector 132 for selectively receiving error signal 140 for providing an accumulated error signal 142 to DCDL 131 for adjusting phase or delay of clock signal 103 to provide adjusted signal 139. Along those lines, demultiplexer 133 may be coupled to phase detector 132 for receiving error signal 140 as a data input and coupled to injection gating block 135 for receiving injection gating signal 144 as a control select input for selectively outputting error signal 140 as either a first error signal 141 or a second error signal 143. For frequency tracking loop 130 operating in the background to update DLL 137 for PVT variations, namely a first or DLL 137 update mode, demultiplexer 133 outputs first error signal 141, namely a DLL 137 error signal, as injection gating signal 144 is not asserted.

If, however, injection gating signal 144 is asserted, then demultiplexer 133 outputs second error signal 143, namely an FLL 138 error signal. In this second or FLL 138 update mode, adjusted signal 139 is no longer being updated by DLL 137, as this loop is temporarily open without first error signal 141. Thus, phase detector 132 may effectively compare phase of adjusted signal 139 to phase of oscillating signal 104.

FLL 138 of frequency tracking loop 130, including in part DCO 122 of MILO 120, may include phase detector 132 and accumulator 136. Again, demultiplexer 133 may be included in FLL 138 for switching between mutually exclusive first and second modes, as previously described.

Again, phase detector 132 may be coupled for receiving adjusted signal 139 and oscillating signal 104 for comparing phases thereof for providing error signal 140. Accumulator 136 may be coupled to phase detector 132 for selectively receiving error signal 140, which in this example is second error signal 143 output from demultiplexer 133 responsive to assertion of injection gating signal 144. Second error signal 143 may be associated with operation of FLL 138, in contrast to first error signal 141 associated with operation of DLL 137, even though both error signals 141 and 143 are commonly sourced from error signal 140 output from phase detector 132.

In FLL 138, DCO 122 may be coupled to accumulator 136 for receiving an accumulated error signal as digital control signal 124. Digital control signal 124 may include a digital control value for adjusting free-running frequency of DCO 122 to a target frequency. This target frequency may be a frequency of reference signal 101 fractionally-N multiplied as associated with frequency control word 102 for providing clock signal 103.

To adjust a free-running frequency of DCO 122 to frequency of clock signal 103, phase detector 132 may indicate if phase of oscillating signal 104 is leading or lagging phase of adjusted signal 139, which is no longer being adjusted as DLL 137 is disabled. Any phase differences may be accumulated by accumulator 136 until a frequency lock is obtained by FLL 138. After a lock is obtained by FLL 138, injection gating signal 144 may be de-asserted to switch from such second mode to such first mode and thus disable FLL 138 in favor of activating DLL 137.

To recapitulate, frequency tracking loop 130 may be implemented to run in a background manner to periodically set free running frequency of DCO 122 at least close to a target frequency. As described above, pulse-gating may be used to switch between an FLL and a DLL, the former of which may be used for setting free running frequency of DCO 122. Thus, high power usage and complexity of a PLL TDC may be avoided.

For purposes of clarity by way of example and not limitation, assume every reference edge of clock signal 103 for some amount of time is used to generate an associated injection pulse on pulse injection signal 123 and a frequency error ("Ferr") arises. In such a situation, DCO 122 may accumulate phase error for (N−1) cycles, where N is a frequency multiplication factor indicated by a current FCW 102. Along those lines, an injected pulse of pulse injection signal 123 may alter an Nth period of oscillating signal 104 output by DCO 122. To mitigate such an event, phase error may be accumulated, and such accumulated phase error may be provided as compensation to mitigate against such error. Along those lines, by using injection pulse gating to disable injection of pulses on pulse injection signal 123, DCO 122 may output oscillating signal 104 at a free-running frequency of DCO 122. Accordingly, a phase relationship between a reference edge of clock signal 103 and an Nth edge of oscillating signal 104 output by DCO 122 may be directly proportional to a frequency error ("Ferr"), if present. Using a sub-sampling bang-bang phase detector ("SS-BBPD") 132 in this example; sign of such Ferr may be detected while operating DLL 137 in the background of operation, as generally indicated as a feedback path arrow 160, with respect to forward operation of fractional-N MILO 100, as generally indicated as a forward path arrow 150. A switch may be made from using DLL 137 to using FLL 138, and accumulated phase error may be used to correct for such Ferr. In short, a background frequency tracking loop 130 may be used to correct for free-running frequency drift of DCO 122, as well as for phase error, as described below in additional detail.

Generally, gain of a DCDL depends on DCDL resolution, which may be provided in picoseconds per least significant bit ("ps/LSB"). Because a gain error in DCDL 113 may introduce deterministic jitter, gain of DCDL 113 may be calibrated using calibration block 112. Along those lines, such deterministic jitter may appear in clock signal 103 if quantization error of delta-sigma modulator 111 is not sufficiently completely cancelled.

Figure 2:
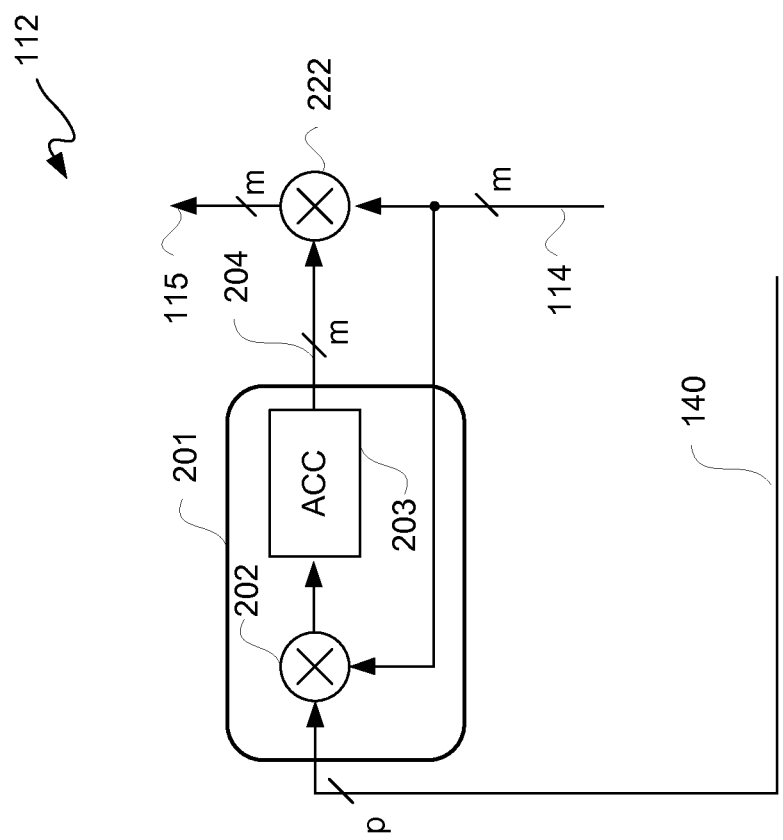
FIG. 2 is a block diagram depicting an exemplary calibration block.

FIG. 2 is a block diagram depicting an exemplary calibration block 112. Calibration block 112 is further described with simultaneous reference to FIGS. 1 and 2.

Calibration block 112 may be used for cancellation, including without limitation complete cancellation, of quantization error in digital word 114 output from delta-sigma modulator 111. Calibration using calibration block 112 may run in the background of operation of fractional-N MILO 100 as part of a calibration loop 170. Calibration loop 170 may include DCDL 113, DCDL 131, phase detector 132, and calibration block 112. Calibration loop 170 may be used to track output frequency of clock signal 103, as well as cancellation of gain error in output of clock signal 103 from DCDL 113. This gain error may be due to one or more PVT variations. For operation of calibration loop 170, oscillating signal 104 of MILO 120 may be provided as an input to phase detector 132 for comparison with phase of adjusted signal 139.

Calibration block 112, with feedback from DLL 137, may be operated in a background feedback path 160 along with DLL 137, with respect to operation of feed forward path 150 of fractional-N MILO 100. In this example, calibration block 112 includes a correlator 201 and a multiplier 202. In this implementation, correlator 201 may be a least-mean square ("LMS") correlator 201. Correlator 201 may be used to detect residual quantization in a digital word 114, namely a quantization signal output from delta-sigma modulator 111. Even if there were no variation in DCDL gain due to PVT variation, the DCDL gain is calibrated to track the operating output frequency. The error signal 140 may be fed back to track output frequency to ensure DCDL gain calibration over a wide range of frequencies of operation. By wide range of frequencies of operation, it is generally meant the maximum frequency of operation is at least twice the minimum frequency of operation.

Generally, DLL 137 digitally accumulates phase error from phase error signal 140 and locks oscillator output, namely oscillating signal 104, to output of DCDL 131, namely adjusted signal 139. DLL 137 may be used to compensate for offset delay between feedforward path 150 and feedback path 160.

By using a bang-bang phase detector for phase detector 132, where such bang-bang phase detector may be operated for sub-sampling, operation of phase detector 132 may be insensitive to a "cycle swallow" action for fractional-N operation. Again, a bang-bang phase detector may be used to obtain a sign of a frequency error for FLL 138 in an FLL mode and to obtain a phase error for DLL 137 in a DLL mode. Moreover, use of a bang-bang phase detector may be less complex and consumes less power than a more complex calibration.

Along those lines, after a forward path 150 phase of fractional-N MILO 100 is locked to an injected pulse of pulse injection signal 123, DLL 137 settles into a locked condition. In a locked condition for DLL 137, an SS-BBPD 132 in this example for phase detector 132 may be used to detect signs of residual quantization errors, if any, in clock signal 103 due to gain error of DCDL 113.

This gain error in clock signal 103 may propagate to phase error signal 140 output from phase detector 132. Phase error signal 140 may be fed back as an input to correlator 201. Phase error signal 140 is a p-bit signal, which in this example is a 1-bit signal. This error in phase error signal 140 may be correlated using a sign-based LMS correlation, as follows.

Error in phase error signal 140 is multiplied with digital word 114, namely an m-bit quantitation signal 114, by multiplier 202 of correlator 201. Output of multiplier 202 is provided to accumulator 203 of correlator 201, and such accumulated output by correlator 201 may be output from accumulator 203 as an m-bit calibration scaling value 204, which in this example is a 10-bit scaling factor ("Kcal"). In an implementation, phase error may be accumulated by correlator 201 to find an LMS error, which may be an optimum scaling factor Kcal for gain of DCDL 113.

Calibration scaling value 204 may be input to multiplier 222 along with quantization signal 114 for multiplication, namely to scale a value of quantization signal 114 by Kcal, to provide an m-bit digital word output from multiplier 222 for calibrated version of a phase or delay control signal 115 input to DCDL 113. Even though 1-bit error, 10-bit quantization, 10-bit scaling, and 10-bit DCDL control signaling is used in the example hereof, these and/or other bit sizes may be used for these signals in other implementations depending on precision used for cancellation.

To avoid an inherent limitation of MILO 120 to integer-N multiplication, a phase relationship between injection pulses of pulse injection signal 123 and oscillating signal 104, which may be provided as an output clock signal, is not constant to operate MILO 120 for fractional-N multiplication. Rather, this phase relationship may perpetually roll over from 0 to 27, or from 0 to a period, T, of DCO 122 ("$T_{DCO}$"), as described below in additional detail with reference to FIG. 3.

Figure 3:
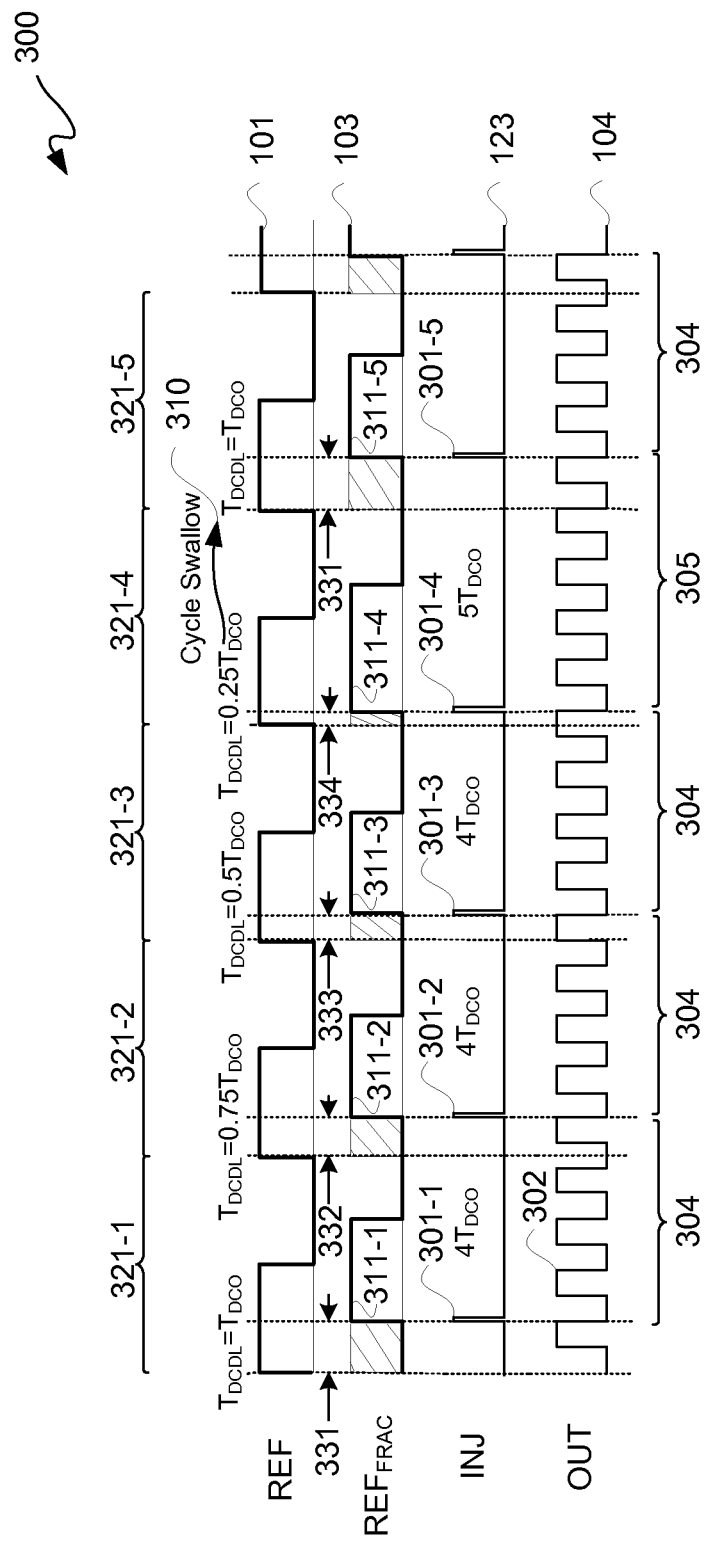
FIG. 3 is a signal diagram depicting an exemplary signal timing for clock multiplication.

FIG. 3 is a signal diagram depicting an exemplary signal timing 300. Signal timing 300 in this example is for examples of signals for reference signal 101, clock signal 103, pulse injection signal 123, and oscillating signal 104 during a forward path 150 steady-state operation of fractional-N MILO 100 of FIG. 1. FIG. 3 is further described with simultaneous reference to FIGS. 1 through 3.

For operation, injection pulses, such as injection pulses 301-1 through 301-5 (collectively pulses 301) of pulse injection signal 123 for example, are aligned with oscillator edges of pulses 302 of oscillating signal 104 during steady-state operation. In this example, rising edges of pulses 301 are aligned to falling edges of corresponding pulses 302. In another implementation, rising-to-falling, falling-to-falling, or falling-to-rising, and/or rising-to-rising edge alignment may be used. Recall that a frequency multiplication factor is provided using a frequency control word (FCW) 102. For purposes of clarity by way of example and not limitation, a frequency multiplication factor of 4.25 is used; however, other non-integer or integer values may be used. Delta-sigma modulator 111 generates a digital word 114 to provide a phase or delay control signal 115 to DCDL 113.

Assuming delta-sigma modulator 111 is a first order DSM, then for a fractional multiplication of 4.25, an output stream of digital word 114 may be "0" for three of four reference-cycles of reference signal 101 and "1" for one of such four reference cycles. This sequence of reference-cycles repeats periodically, so an average may be equal to a fractional part, namely 0.25 in this example, by injecting pulses after 4 output-cycles 3 times and then injecting pulses after 5 output-cycles 1 time. For example: from a rising edge of pulse 301-1, there are four periods of oscillating signal 104, namely $4T_{DCO}$, in interval 304 before a rising edge of injected pulse 301-2; from a rising edge of pulse 301-2, there are another four periods of oscillating signal 104, namely $4T_{DCO}$, in another interval 304 before a rising edge of injected pulse 301-3; from a rising edge of pulse 301-3, there are yet another four periods of oscillating signal 104, namely $4T_{DCO}$, in yet another interval 304 before a rising edge of injected pulse 301-4; and from a rising edge of pulse 301-4, there are five periods of oscillating signal 104, namely $5T_{DCO}$, in an interval 305 before a rising edge of a first of another sequence of injected pulses 301.

To obtain this fractional relationship every x number of repeated output cycles, such as a repetition of 21 output cycles of oscillating signal 104 during steady state operation, edges of clock signal 103 are systematically delayed with reference to corresponding edges of reference signal 101. For example, rising edges of pulses 301-1 through 301-5 are injected corresponding to and in phase with rising edges of pulses 311-1 through 311-5, respectively, of clock signal 103. In another implementation, rising-to-falling, falling-to-falling, or falling-to-rising edge alignment may be used.

However, even though period T of reference signal 101 is generally constant, period T of clock signal 103 changes as adjusted with DCDL 113. Effectively, reference edges of reference signal 101 may be systemically delayed to cancel induced DSM quantization error to keep injection pulses 301 aligned with corresponding output edges of oscillating signal 104. In this example, a reference edge of reference signal 101 is decremented by $0.25T_{DCO}$ on each reference cycle of reference signal 101.

For example, in a first reference cycle 321-1 of a sequence, DCDL 113 may be used to introduce a delay 331 of one period of oscillating signal 104, namely $1.00 \times T_{DCO}$. Along those lines, it should be understood that frequency of oscillating signal 104 is higher than frequency of reference signal 101. Continuing the above example, in a second reference cycle 321-2 of a sequence, DCDL 113 may be used to introduce an additional delay 332 of 0.75 of a period of oscillating signal 104, namely $0.75 \times T_{DCO}$; in a third reference cycle 321-3 of a sequence, DCDL 113 may be used to introduce another additional delay 333 of 0.50 of a period of oscillating signal 104, namely $0.50 \times T_{DCO}$; and in a fourth reference cycle 321-4 of a sequence, DCDL 113 may be used to introduce yet another additional delay 334 of 0.25 of a period of oscillating signal 104, namely $0.25 \times T_{DCO}$. This sequence of progressive delay from a period to progressive fractional decrements of a period of oscillating signal 104 eventually leads to using an extra cycle of oscillating signal 104, namely a cycle swallow 310, in a steady-state time interval 305 as compared with other steady-state time intervals 304.

Along those lines, in a fifth reference cycle 321-5, DCDL 113 may be used to again introduce a delay 331 of one period of oscillating signal 104, namely $1.00 \times T_{DCO}$, to begin a new sequence. This is to ensure a same sequence may be repeated; however, one output cycle of oscillating signal 104 is "swallowed" in interval 305 for this operation corresponding to a last cycle of a sequence of cycles of reference signal 101, namely a fourth cycle 321-4 in this example. During steady state operation for this example, the number of injection pulses 301 for a sequence is equal to 4 in 17 output cycles of oscillating signal 104, indicating a fractional-N multiplication of 4.25. Generally, a frequency multiplication factor N of fractional-N MILO 100 depends on the rate of a cycle swallow operation, and thus even though in this example a single cycle of oscillating signal 104 was consumed by cycle swallow 310, in another fractional implementation more than one extra cycle of oscillating signal 104 may be consumed.

Figure 4:
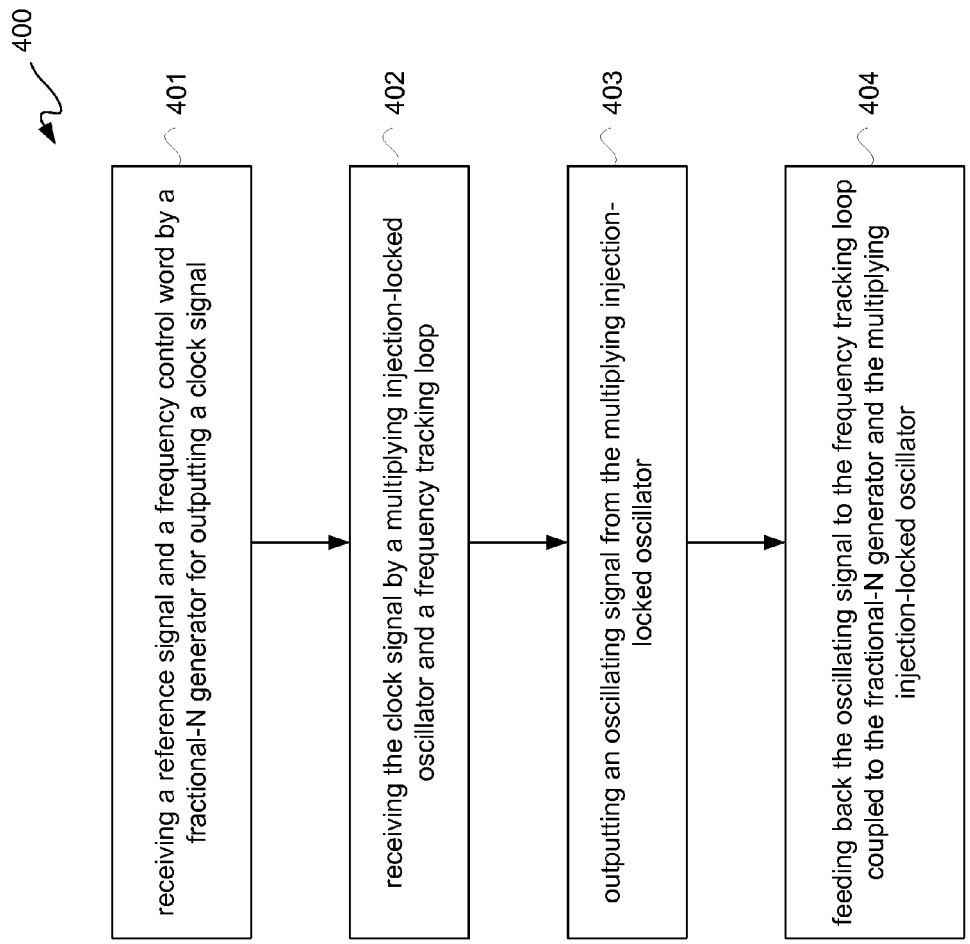
FIG. 4 is a flow diagram depicting an exemplary signal generation process for generating an oscillating output signal in FIG. 1.

FIG. 4 is a flow diagram depicting an exemplary signal generation process 400 for generating an oscillating signal 104 of FIG. 1. With simultaneous reference to FIGS. 1 through 4, operations 401 through 404 of signal generation process 400 are described. At 401, a reference signal 101 and a frequency control word 102 are received by a fractional-N generator 110 for outputting a clock signal 103. At 402, clock signal 103 is received by a multiplying injection-locked oscillator 120 and a frequency tracking loop 130. At 403, an oscillating signal 104 may be output from multiplying injection-locked oscillator 120. At 404, oscillating signal 104 may be fed back to frequency tracking loop 130 coupled to fractional-N generator 110 and multiplying injection-locked oscillator 120.

Figure 5:
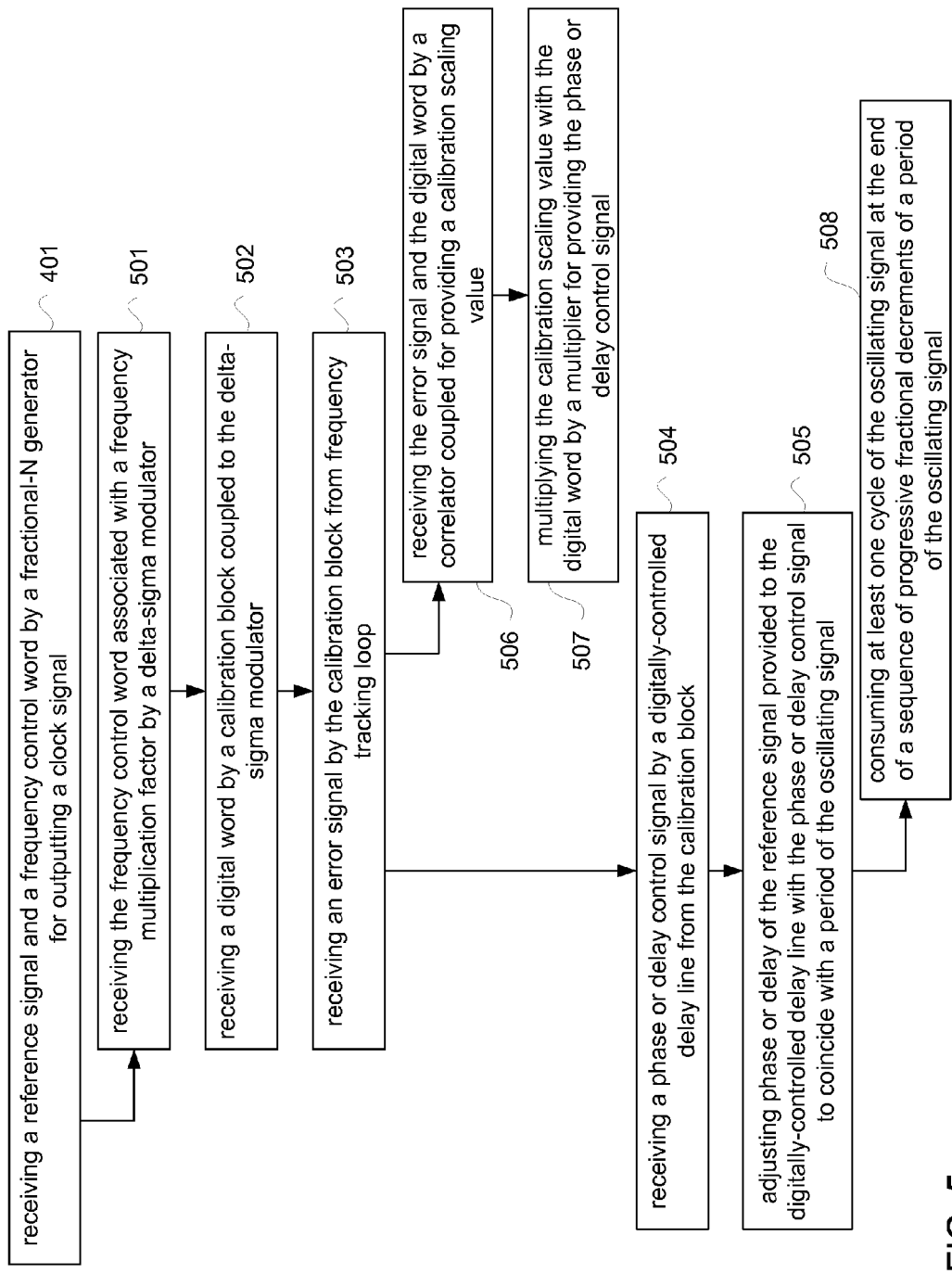
FIG. 5 is a flow diagram depicting an exemplary operation of the signal generation process of FIG. 4 for generating the oscillating output signal of FIG. 1.

FIG. 5 is a flow diagram depicting an exemplary operation 401 of signal generation process 400 for generating an oscillating signal 104 of FIG. 1. With simultaneous reference to FIGS. 1 through 5, operations 501 through 508 of operation 401 of signal generation process 400 are described.

At 501, operation of fractional-N generator 110 includes receiving a frequency control word 102 associated with a frequency multiplication factor by a delta-sigma modulator 111. At 502, a digital word 114 may be received by a calibration block 112 coupled to delta-sigma modulator 111. At 503, an error signal 140 may be received by calibration block 112 from frequency tracking loop 130. At 504, a phase or delay control signal 115 may be received by a digitally-controlled delay line 113 from calibration block 112. At 505, phase or delay of reference signal 101 provided to digitally-controlled delay line 113 may be adjusted with the phase or delay control signal 115 to coincide with a period of oscillating signal 104.

Operation of calibration block 112 at 503 may include at 506 receiving error signal 140 and digital word 114 by a correlator 201 coupled for providing a calibration scaling value 204. At 507, calibration scaling value 204 may be multiplied with digital word 114 by a multiplier 202 for providing phase or delay control signal 115.

Accordingly, at 505, oscillating signal 104 may have edges aligned with the clock signal 103 responsive to edges of injected pulses 301 from pulse injection signal 123 for fractional-N operation for a frequency control word 102. Such edge alignment may include at 508 consuming at least one cycle of oscillating signal 104 at the end of a sequence of progressive fractional decrements of a period of oscillating signal 104 provided as additional delays added to clock signal 103.

Figure 6:
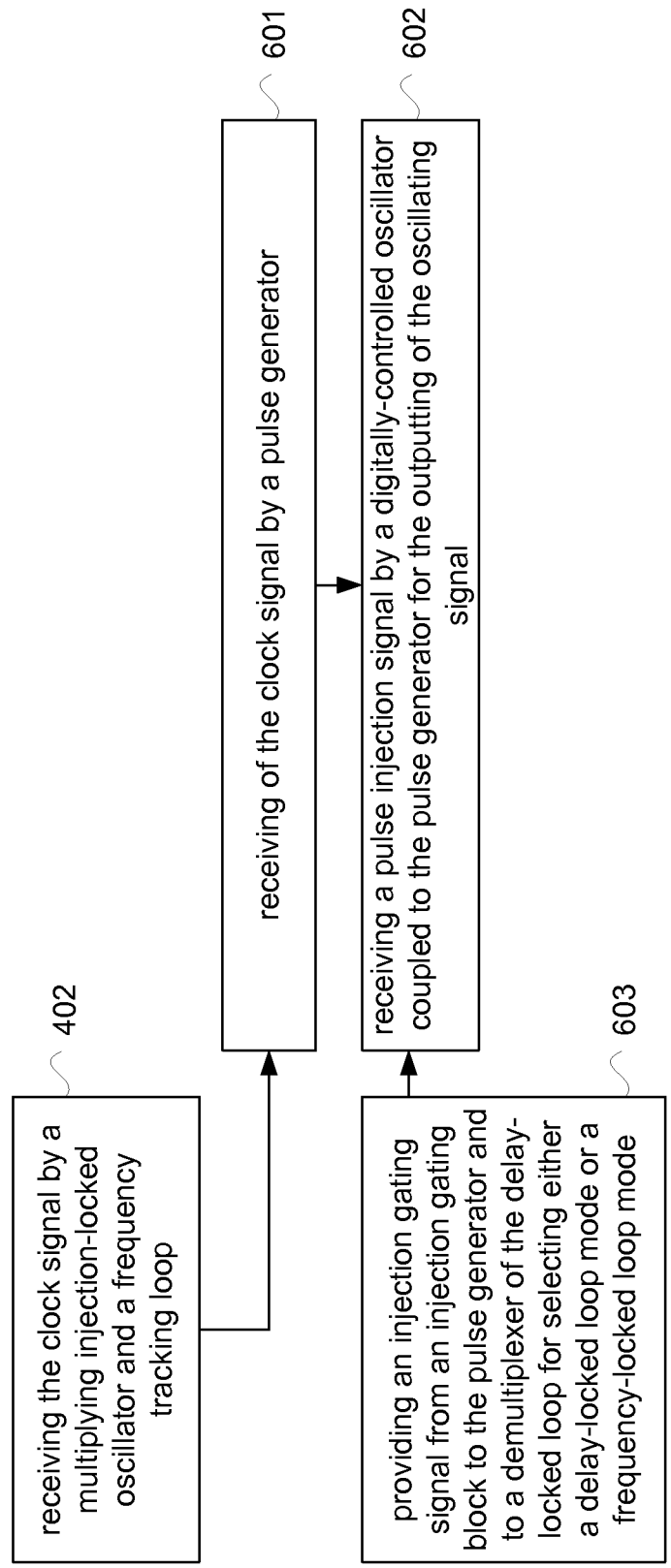
FIG. 6 is a flow diagram depicting another exemplary operation of the signal generation process of FIG. 4 for generating the oscillating output signal of FIG. 1.

FIG. 6 is a flow diagram depicting an exemplary operation 402 of signal generation process 400 for generating an oscillating signal 104 of FIG. 1. With simultaneous reference to FIGS. 1 through 6, operations 601 and 603 of operation 402 of signal generation process 400 are described.

At 601, operation of multiplying injection-locked oscillator 120 includes receiving clock signal 103 by a pulse generator 121. At 602, a pulse injection signal 123 may be received by a digitally-controlled oscillator 122 coupled to pulse generator 121 for outputting of oscillating signal 104.

Operation of frequency tracking loop 130 may further include at 603 providing an injection gating signal 144 from an injection gating block 135 to pulse generator 121 and to a demultiplexer 133 of delay-locked loop 137 for selecting either a delay-locked loop mode or a frequency-locked loop mode. For a frequency-locked loop mode, pulses are not provided via pulse injection signal 123, as an operation at 603 may temporarily disable providing of such pulses and switching of active paths by demultiplexer 133, as previously described.

Figure 7:
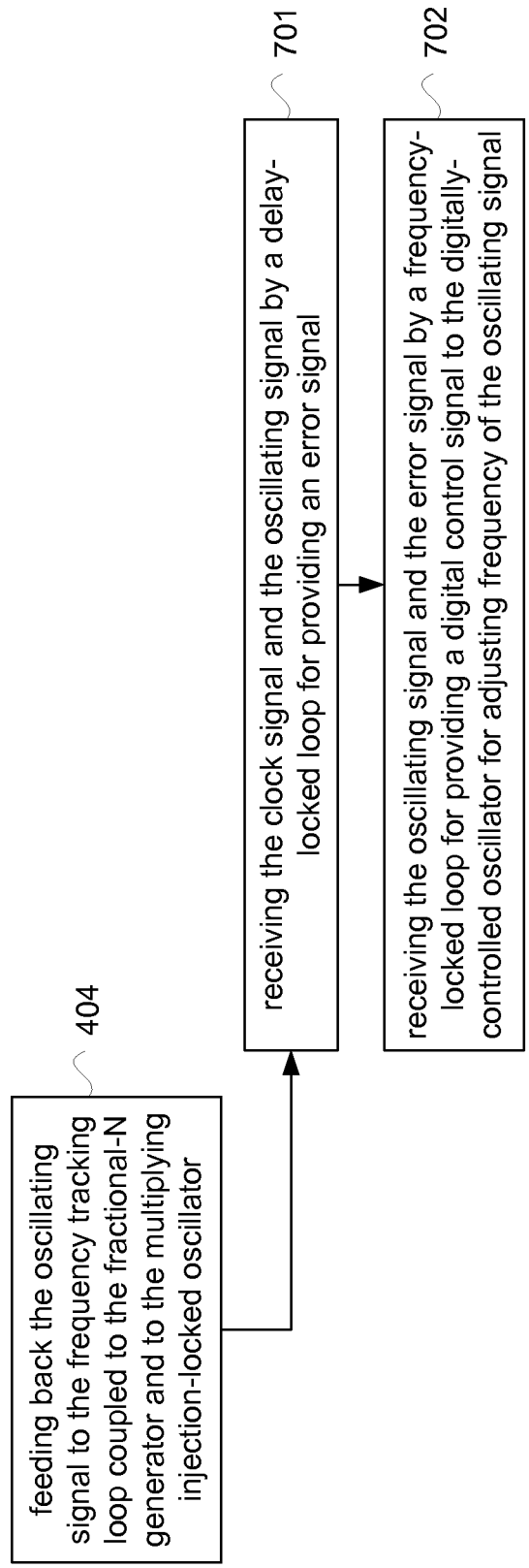
FIG. 7 is a flow diagram depicting yet another exemplary operation of the signal generation process of FIG. 4 for generating the oscillating output signal of FIG.

FIG. 7 is a flow diagram depicting an exemplary operation 404 of signal generation process 400 for generating an oscillating signal 104 of FIG. 1. With simultaneous reference to FIGS. 1 through 7, operations 701 and 702 of operation 404 of signal generation process 400 are described.

At 701, operation of frequency tracking loop 130 includes receiving clock signal 103 and oscillating signal 104 by a delay-locked loop 137 for providing an error signal 140. At 702, oscillating signal 104 and error signal 140 may be received by a frequency-locked loop 138 for providing a digital control signal 124 to digitally-controlled oscillator 122 for adjusting frequency of oscillating signal 104.

Because fractional-N MILO 100 may be substantially compact, multiple fractional-N MILOs 100 may be implemented in a single chip, such as a single system-on-chip ("SoC"), such as an FPGA for example An FPGA for example may include multiple transceivers, and such transceivers may be coupled to multiple wireline communications channels. These multiple wireline communications channels may be supporting various communication protocols or specifications, and these various communication protocols or specifications may call for different frequencies over a wide range of possible frequencies. A fractional-N MILO 100 can synthesize a clock signal, such as oscillating signal 104, with a continuous frequency range using a single reference signal 101. Along those lines a single crystal oscillator may be used to provide a reference frequency. In addition to a wide frequency range, multi-phase clock signals may be synthesized.

Versatility and compactness of fractional-N MILO 100 may be provided with low jitter, as narrow pulses may be injected at a reference signal 101 frequency rate into DCO 122 to mitigate against jitter accumulation in DCO 122. Additionally, in contrast to a PLL, fractional-N MILO 100 does not include a charge pump or a loop filter used in analog PLLs and does not include a TDC used in digital PLLs. Avoiding such PLL components eliminates phase noise contribution of such components.

Because one or more of the examples described herein may be implemented in an FPGA, a detailed description of such an IC is provided. However, it should be understood that other types of ICs may benefit from the technology described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

Figure 8:
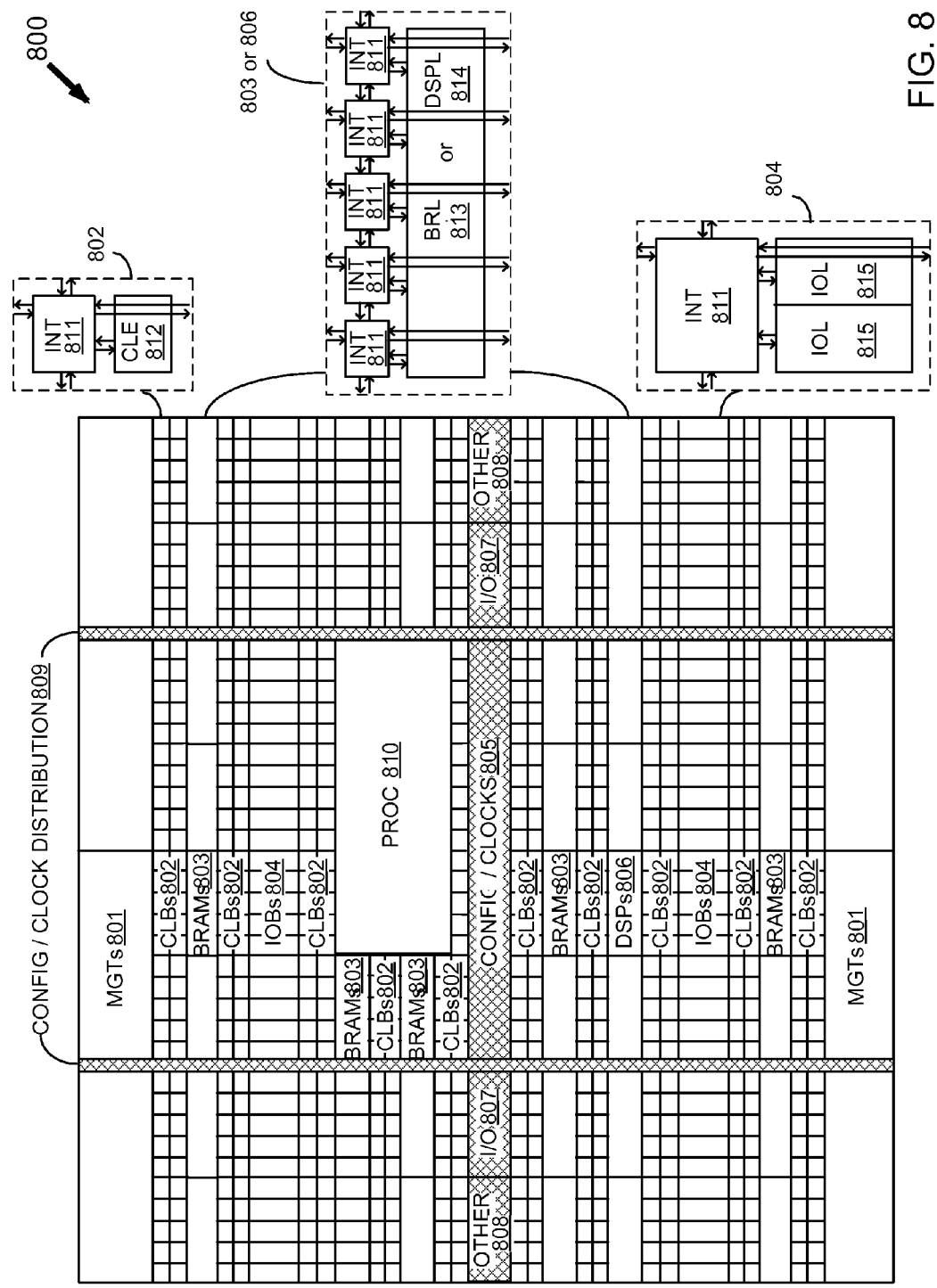
FIG. 8 is a block diagram depicting an exemplary columnar Field Programmable Gate Array ("FPGA") architecture.

As noted above, advanced FPGAs can include several different types of programmable logic blocks in the array. For example, FIG. 8 illustrates an FPGA architecture 800 that includes a large number of different programmable tiles including multi-gigabit transceivers ("MGTs") 801, configurable logic blocks ("CLBs") 802, random access memory blocks ("BRAMs") 803, input/output blocks ("IOBs") 804, configuration and clocking logic ("CONFIG/CLOCKS") 805, digital signal processing blocks ("DSPs") 806, specialized input/output blocks ("I/O") 807 (e.g., configuration ports and clock ports), and other programmable logic 808 such as digital clock managers, analog-to-digital converters, system monitoring logic, and so forth. Some FPGAs also include dedicated processor blocks ("PROC") 810.

In some FPGAs, each programmable tile includes a programmable interconnect element ("INT") 811 having standardized connections to and from a corresponding interconnect element in each adjacent tile. Therefore, the programmable interconnect elements taken together implement the programmable interconnect structure for the illustrated FPGA. The programmable interconnect element 811 also includes the connections to and from the programmable logic element within the same tile, as shown by the examples included at the top of FIG. 8.

For example, a CLB 802 can include a configurable logic element ("CLE") 812 that can be programmed to implement user logic plus a single programmable interconnect element ("INT") 811. A BRAM 803 can include a BRAM logic element ("BRL") 813 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 806 can include a DSP logic element ("DSPL") 814 in addition to an appropriate number of programmable interconnect elements. An 10B 804 can include, for example, two instances of an input/output logic element ("IOL") 815 in addition to one instance of the programmable interconnect element 811. As will be clear to those of skill in the art, the actual I/O pads connected, for example, to the I/O logic element 815 typically are not confined to the area of the input/output logic element 815.

In the pictured embodiment, a horizontal area near the center of the die (shown in FIG. 8) is used for configuration, clock, and other control logic. Vertical columns 809 extending from this horizontal area or column are used to distribute the clocks and configuration signals across the breadth of the FPGA.

Some FPGAs utilizing the architecture illustrated in FIG. 8 include additional logic blocks that disrupt the regular columnar structure making up a large part of the FPGA. The additional logic blocks can be programmable blocks and/or dedicated logic. For example, processor block 810 spans several columns of CLBs and BRAMs.

Note that FIG. 8 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 8 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

Such a compact nature of a fractional-N MILO 100 of FIG. 1, allows same to be closely positioned to signal channels, such as communication signal channels. For high frequency operation in particular, having less distance to drive a clock signal from source to sink may significantly reduce power consumption. Along those lines, distribution of high-frequency clock power may be as high as approximately 30% to 40% of channel power. Furthermore, multiple fractional-N MILOs 100 may be employed for a fractional-N MILO 100 per channel.

Figure 9:
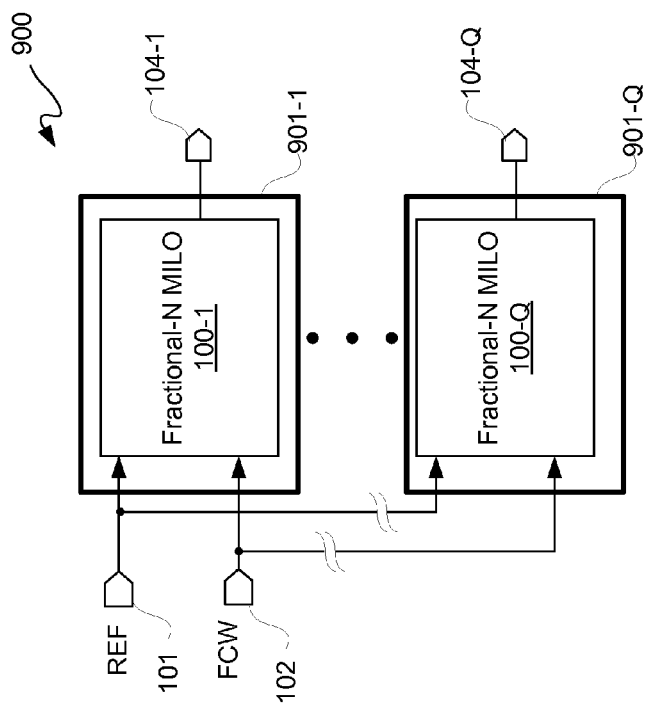
FIG. 9 is a block diagram depicting an exemplary system for generating a plurality of oscillating output signals.

Along those lines, FIG. 9 is a block diagram depicting an exemplary system 900 for generating a plurality of oscillating signals 104-1 through 104-Q, for Q a positive integer greater than one. System 900 includes a plurality of fractional-N multiplying injection-locked oscillators 100-1 through 100-Q commonly coupled to receive a reference signal 101. Fractional-N multiplying injection-locked oscillators 100-1 through 100-Q may be in corresponding transceivers, receivers, or transmitters 901-1 through 901-Q.

In this example, each of fractional-N multiplying injection-locked oscillators 100-1 through 100-Q is commonly coupled to receive a same FCW 102. Accordingly, fractional-N multiplying injection-locked oscillators 100-1 through 100-Q may be used to provide oscillating signals 104-1 through 104-Q as separate instances of an oscillating signal for a plurality of communications channels, or other plurality of signal channels, employing a same fractional-N clock signal.

Figure 10:
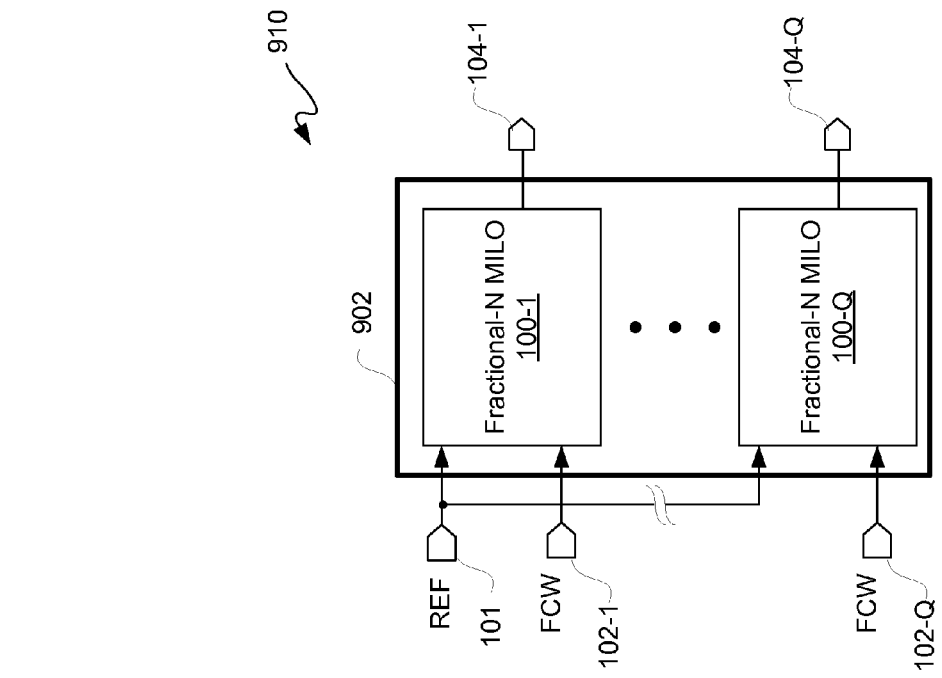
FIG. 10 is a block diagram depicting another exemplary system for generating a plurality of oscillating output signals.

FIG. 10 is a block diagram depicting an exemplary system 910 for generating a plurality of oscillating signals 104-1 through 104-Q, for Q a positive integer greater than one. System 910 includes a plurality of fractional-N multiplying injection-locked oscillators 100-1 through 100-Q commonly coupled to receive a reference signal 101. Fractional-N multiplying injection-locked oscillators 100-1 through 100-Q may be in corresponding transceivers, receivers, or transmitters 901-1 through 901-Q, as in FIG. 9, or in a bank 902 of transceivers, transmitters, or receivers.

In this example, each of fractional-N multiplying injection-locked oscillators 100-1 through 100-Q is respectively coupled to receive FCWs 102-1 through 102-Q. Accordingly, fractional-N multiplying injection-locked oscillators 100-1 through 100-Q may be used to provide oscillating signals 104-1 through 104-Q as separate instances of at least two different oscillating signals for a plurality of communications channels, or other plurality of signal channels, employing different fractional-N clock signals.

While the foregoing describes exemplary apparatus(es) and/or method(s), other and further examples in accordance with the one or more aspects described herein may be devised without departing from the scope hereof, which is determined by the claims that follow and equivalents thereof. Claims listing steps do not imply any order of the steps. Trademarks are the property of their respective owners.

What is claimed is:

1. An apparatus for generating an oscillating signal, comprising:
    a fractional-N generator for receiving a frequency control word and a reference signal;
    a multiplying injection-locked oscillator coupled to the fractional-N generator for receiving a clock signal, and for outputting an oscillating signal; and
    a frequency tracking loop coupled to the fractional-N generator for receiving the clock signal, and further coupled to the multiplying injection-locked oscillator for receiving the oscillating signal.

2. The apparatus according to claim 1, wherein the multiplying injection-locked oscillator comprises:
    a pulse generator coupled to the fractional-N generator for receiving the clock signal associated with a fractional-N multiplication; and
    a digitally-controlled oscillator coupled to the pulse generator for receiving a pulse injection signal for outputting the oscillating signal.

3. The apparatus according to claim 2, wherein the frequency tracking loop comprises:
    a delay-locked loop for receiving the clock signal and the oscillating signal, and for providing an error signal; and
    a frequency-locked loop for receiving the oscillating signal and the error signal, and for providing a digital control signal to the digitally-controlled oscillator for adjusting a frequency of the oscillating signal.

4. The apparatus according to claim 3, wherein the fractional-N generator comprises:
a delta-sigma modulator for receiving the frequency control word associated with a frequency multiplication factor;
a calibration block coupled to the delta-sigma modulator for receiving a digital word, and further coupled to the frequency tracking loop for receiving the error signal; and
a digitally-controlled delay line coupled to the calibration block for receiving a phase or delay control signal, and for adjusting a phase or delay of the reference signal provided to the digitally-controlled delay line to coincide with a period of the oscillating signal.

5. The apparatus according to claim 4, wherein the calibration block comprises:
a correlator coupled for receiving the error signal and the digital word, and for providing a calibration scaling value; and
a multiplier coupled for multiplying the calibration scaling value with the digital word, and for providing the phase or delay control signal.

6. The apparatus according to claim 4, wherein:
the digitally-controlled delay line is a first digitally-controlled delay line;
the calibration block, the first digitally-controlled delay line, a second digitally-controlled delay line of the delay-locked loop, and a phase detector of the delay-locked loop are coupled in a calibration loop; and
the oscillating signal of the multiplying injection-locked oscillator is coupled as an input to the phase detector.

7. The apparatus according to claim 4, wherein the digitally-controlled delay line is a first digitally-controlled delay line; and wherein the delay-locked loop comprises:
a second digitally-controlled delay line coupled to the fractional-N generator for receiving the clock signal;
a phase detector coupled to the digitally-controlled oscillator for receiving the oscillating signal;
an accumulator coupled to the phase detector for receiving the error signal, for providing an accumulated error signal to the second digitally-controlled delay line, for adjusting a phase or delay of the clock signal, and for providing an adjusted signal; and
wherein the phase detector is coupled for receiving the adjusted signal.

8. The apparatus according to claim 7, wherein:
the accumulator is a first accumulator;
the accumulated error signal is a first accumulated error signal; and
the frequency-locked loop, including in part the digitally-controlled oscillator of the multiplying injection-locked oscillator, comprises:
the phase detector;
a second accumulator coupled to the phase detector for receiving the error signal; and
wherein the digitally-controlled oscillator is coupled to the second accumulator for receiving a second accumulated error signal as the digital control signal.

9. The apparatus according to claim 3, wherein the frequency tracking loop comprises an injection gating block coupled for providing an injection gating signal to the pulse generator, and further coupled to a demultiplexer of the delay-locked loop.

10. The apparatus according to claim 9, wherein the delay-locked loop comprises:

a digitally-controlled delay line coupled to the fractional-N generator for receiving the clock signal;
a phase detector coupled to the digitally-controlled oscillator for receiving the oscillating signal;
the demultiplexer being coupled to the phase detector for receiving the error signal as a data input, and for receiving the injection gating signal as a select input for selectively outputting the error signal as either a first error signal or a second error signal;
a first accumulator coupled to the demultiplexer for selectively receiving the first error signal, for providing a first accumulated error signal to the digitally-controlled delay line, for adjusting a phase or delay of the clock signal, and for providing an adjusted clock signal; and
the phase detector being coupled for receiving the adjusted clock signal.

11. The apparatus according to claim 10, wherein the frequency-locked loop comprises:
the phase detector being coupled to the digitally-controlled oscillator for receiving the oscillating signal;
the demultiplexer being coupled to the phase detector for receiving the error signal as the data input and receiving the injection gating signal as the select input, and for selectively outputting the error signal as either the first error signal or the second error signal; and
a second accumulator coupled to the demultiplexer for selectively receiving the second error signal;
wherein the digitally-controlled oscillator is coupled to the second accumulator for receiving a second accumulated error signal as the digital control signal.

12. A method for generating an oscillating signal, comprising:
receiving a reference signal and a frequency control word by a fractional-N generator for outputting a clock signal;
receiving the clock signal by a multiplying injection-locked oscillator and a frequency tracking loop;
outputting an oscillating signal from the multiplying injection-locked oscillator; and
feeding back the oscillating signal to the frequency tracking loop;
wherein the frequency tracking loop is coupled to the fractional-N generator and to the multiplying injection-locked oscillator.

13. The method according to claim 12, wherein operation of the multiplying injection-locked oscillator comprises:
receiving of the clock signal by a pulse generator; and
receiving a pulse injection signal by a digitally-controlled oscillator coupled to the pulse generator for the outputting of the oscillating signal.

14. The method according to claim 13, wherein operation of the frequency tracking loop comprises:
receiving the clock signal and the oscillating signal by a delay-locked loop for providing an error signal;
receiving the oscillating signal and the error signal by a frequency-locked loop; and
providing a digital control signal from the frequency-locked loop to the digitally-controlled oscillator for adjusting a frequency of the oscillating signal.

15. The method according to claim 14, wherein operation of the fractional-N generator comprises:
receiving the frequency control word associated with a frequency multiplication factor by a delta-sigma modulator;
receiving a digital word by a calibration block coupled to the delta-sigma modulator;
receiving an error signal by the calibration block from frequency tracking loop;

receiving a phase or delay control signal by a digitally-controlled delay line from the calibration block; and adjusting a phase or delay of the reference signal provided to the digitally-controlled delay line with the phase or delay control signal, to coincide with a period of the oscillating signal.

16. The method according to claim 15, wherein operation of the calibration block comprises:

receiving the error signal and the digital word by a correlator coupled for providing a calibration scaling value; and multiplying the calibration scaling value with the digital word by a multiplier, for providing a calibrated version of the phase or delay control signal.

17. The method according to claim 14, wherein operation of the frequency tracking loop comprises providing an injection gating signal from an injection gating block to the pulse generator and to a demultiplexer of the delay-locked loop, for selecting either a delay-locked loop mode or a frequency-locked loop mode.

18. The method according to claim 14, wherein the oscillating signal has edges aligned with the clock signal responsive to edges of injected pulses from the pulse injection signal, for fractional-N operation for the frequency control word.

19. The method according to claim 14, further comprising consuming at least one cycle of the oscillating signal at an end of a sequence of progressive fractional decrements of a period of the oscillating signal, by adding additional delays to the clock signal.

20. A system for generating a plurality of oscillating signals, comprising:

a plurality of fractional-N multiplying injection-locked oscillators commonly coupled to receive a reference signal;

wherein each fractional-N multiplying injection-locked oscillator of the plurality of fractional-N multiplying injection-locked oscillators comprises:

a fractional-N generator for receiving a frequency control word and the reference signal;

a multiplying injection-locked oscillator coupled to the fractional-N generator for receiving a clock signal for outputting an oscillating signal; and a frequency tracking loop coupled to the fractional-N generator for receiving the clock signal, and further coupled to the multiplying injection-locked oscillator for receiving the oscillating signal.

* * * * *